(12) United States Patent
Kim et al.

(10) Patent No.: US 8,902,632 B2
(45) Date of Patent: Dec. 2, 2014

(54) HYBRID RESISTIVE MEMORY DEVICES AND METHODS OF OPERATING AND MANUFACTURING THE SAME

(71) Applicant: Samsung Electronics Co., Ltd., Suwon-Si (KR)

(72) Inventors: Young-bae Kim, Seoul (KR); Hyun-sang Hwang, Gwangju (KR); Chang-jung Kim, Yongin-si (KR)

(73) Assignees: Samsung Electronics Co., Ltd., Gyeonggi-Do (KR); Gwangju Institute of Science and Technology, Gwangju (KR)

( * ) Notice: Subject to any disclaimer, the term of this patent is extended or adjusted under 35 U.S.C. 154(b) by 37 days.

(21) Appl. No.: 13/718,206

(22) Filed: Dec. 18, 2012

(65) Prior Publication Data

US 2013/0301338 A1  Nov. 14, 2013

(30) Foreign Application Priority Data

May 9, 2012  (KR) .................. 10-2012-0049269

(51) Int. Cl.
| G11C 11/00 | (2006.01) |
| G11C 13/00 | (2006.01) |
| G11C 11/56 | (2006.01) |
| H01L 45/00 | (2006.01) |
| G11C 11/21 | (2006.01) |

(52) U.S. Cl.
CPC ............ *G11C 11/21* (2013.01); *G11C 2213/15* (2013.01); *G11C 13/0007* (2013.01); *G11C 2213/32* (2013.01); *G11C 11/5685* (2013.01); *H01L 45/147* (2013.01); *H01L 45/04* (2013.01); *H01L 45/1233* (2013.01); *G11C 13/0069* (2013.01); *H01L 45/08* (2013.01); *G11C 2213/31* (2013.01); *H01L 45/16* (2013.01); *H01L 45/146* (2013.01)
USPC ............... 365/148; 365/46; 365/55; 365/74; 365/97; 365/100; 365/131; 365/158; 365/171; 365/173; 365/163

(58) Field of Classification Search
CPC ....... H01L 45/08; H01L 45/04; H01L 27/101; H01L 27/1052; H01L 45/1633; H01L 21/02181; H01L 21/02186; H01L 21/02189; H01L 21/022; G11C 13/0007; G11C 2213/32; G11C 2213/72; G11C 2213/79; G11C 2013/0073; G11C 11/5685; G11C 13/0002; G11C 14/0045; G11C 2213/34
USPC ......... 365/46, 55, 74, 97, 100, 131, 148, 158, 365/171, 173, 163
See application file for complete search history.

(56) References Cited

U.S. PATENT DOCUMENTS

2008/0278989 A1* 11/2008 Lee et al. .................. 365/148
2010/0213433 A1*  8/2010 Yamamoto et al. ............ 257/4
(Continued)

FOREIGN PATENT DOCUMENTS

| JP | 2010146514 A | 7/2010 |
| KR | 20090084682 A | 8/2009 |

(Continued)

*Primary Examiner* — Fernando Hidalgo
(74) *Attorney, Agent, or Firm* — Harness, Dickey & Pierce, P.L.C.

(57) ABSTRACT

Hybrid resistive memory devices and methods of operating and manufacturing the same, include at least two resistive memory units. At least one of the at least two resistive memory units is a resistive memory unit configured to operate in a long-term plasticity state.

15 Claims, 6 Drawing Sheets

(56) References Cited

U.S. PATENT DOCUMENTS

2010/0232208 A1* 9/2010 Maejima et al. ............. 365/148
2011/0103131 A1* 5/2011 Katayama et al. ............ 365/148
2012/0074369 A1* 3/2012 Osano et al. ...................... 257/2

FOREIGN PATENT DOCUMENTS

| | | |
|---|---|---|
| KR | 100997214 B1 | 11/2010 |
| KR | 20110110290 A | 10/2011 |

* cited by examiner

HYBRID RESISTIVE MEMORY DEVICES AND METHODS OF OPERATING AND MANUFACTURING THE SAME

CROSS-REFERENCE TO RELATED APPLICATIONS

This application claims the benefit of priority under 35 U.S.C. §119 from Korean Patent Application No. 10-2012-0049269, filed on May 9, 2012, in the Korean Intellectual Property Office, the disclosure of which is incorporated herein by reference in its entirety.

BACKGROUND

1. Field

Example embodiments relate to hybrid resistive memory devices, and more particularly, to hybrid resistive memory devices including two or more resistive memory devices which are serially connected, and methods of operating and manufacturing the same.

2. Description of the Related Art

The brain of an animal receives lots of information, processes the information, gives a command to each body part, and sustains life. A cerebral cortex, which surrounds a surface of a cerebral hemisphere, plays a key role in receiving information, making determinations, and giving commands. The cerebral cortex includes a plurality of nerve cells called neurons, which include a plurality of projections. Each of the neurons includes a cell body, an axon, and dendrites. The axon contacts another nerve cell and sends information, and the dendrites receive signals.

At a synapse, an end of an axon of one neuron comes into close apposition with dendrites of a next neuron. Information storage and signal transmission occur due to a change in weight in the synapse by two plasticities (short-term plasticity and long-term plasticity). When the short-term plasticity occurs, the weight of the synapse is increased for a short period of time and rapidly returns to its initial state. If the synapse is continuously stimulated and the long-term plasticity occurs, the synapse is permanently changed. The long-term plasticity may occur more effectively with a smaller number of stimulations at shorter intervals than the short-term plasticity. Although the neuron has such an effective information processing mechanism, it is said to be difficult to simulate such plasticities of the neuron by using software because of a complicated process of the brain.

SUMMARY

Example embodiments relate to hybrid resistive memory devices, and more particularly, to hybrid resistive memory devices including two or more resistive memory devices which are serially connected, and methods of operating and manufacturing the same.

According to example embodiments, a hybrid resistive memory device includes at least two resistive memory units, wherein at least one of the at least two resistive memory units is a resistive memory unit configured to operate in a long-term plasticity state.

At least one of the at least two resistive memory units may be a resistive memory unit configured to operate in a short-term plasticity state.

The resistive memory unit configured to operate in the short-term plasticity state may include a memory resistive layer between electrodes. The memory resistive layer may include a perovskite oxide.

The memory resistive layer may include at least one selected from PrCaMnO (PCMO), $CaMnO_3$ (CMO), $CaTiO_3$, $BaTiO_3$, $SrTiO_3$, $KTaO_3$, $KNbO_3$, $NaNbO_3$ and a combination thereof.

The resistive memory unit configured to operate in the short-term plasticity state may have a resistance that changes due to movement of oxygen holes or charge trapping.

The at least two resistive memory units may be resistive memory units configured to operate in the long-term plasticity state.

The resistive memory unit configured to operate in the long-term plasticity state may include a memory resistive layer between electrodes. The resistive memory unit may include a transition metal oxide.

The transition metal oxide may be one selected from a nickel (Ni) oxide, a titanium (Ti) oxide, a hafnium (Hf) oxide, a zirconium (Zr) oxide, a zinc (Zn) oxide, a tungsten (W) oxide, a cobalt (Co) oxide, a niobium (Nb) oxide and a combination thereof.

The resistive memory unit configured to operate in the long-term plasticity state may have a resistance that changes when filaments are formed.

The hybrid resistive memory device may include a lower electrode, and a first memory resistive layer, an intermediate electrode, a second memory resistive layer, and an upper electrode sequentially stacked on the lower electrode.

Each of the lower electrode, the intermediate electrode, and the upper electrode may include at least one selected from aluminum (Al), gold (Au), copper (Cu), cobalt (Co), zirconium (Zr), zinc (Zn), tungsten (W), iridium (Ir), ruthenium (Ru), platinum (Pt), titanium (Ti), hafnium (Hf), TiN and a combination thereof.

The at least two resistive memory units may be serially connected.

According to other example embodiments, a method of operating a hybrid resistive memory device including at least two resistive memory units includes forming a short-term plasticity state and a long-term plasticity state in the at least two resistive memory units by gradually increasing a voltage applied by a power supply unit to the at least two resistive memory units. At least one of the at least two resistive memory unit is configured to operate in the long-term plasticity resistive state.

At least one of the at least two resistive memory units may be a resistive memory unit configured to operate in the short-term plasticity state. The forming of the short-term plasticity state and the long-term plasticity state may include reducing a resistance of the resistive memory unit configured to operate in the long-term plasticity state by applying a pulse voltage using the power supply unit, after reducing a resistance of the resistive memory unit configured to operate in the short-term plasticity resistive state.

The at least two resistive memory units may be resistive memory units configured to operate in the long-term plasticity state in. The forming of the short-term plasticity state and the long-term plasticity state may include sequentially reducing resistances of the resistive memory units configured to operate in the long-term plasticity state by applying a pulse voltage using the power supply unit.

According to further example embodiments, a method of manufacturing a hybrid resistive memory device including at least two resistive memory units includes sequentially forming a first memory resistive layer, an intermediate electrode, a second memory resistive layer, and an upper electrode on a lower electrode, wherein at least one of the at least two resistive memory units is configured to operate in a long-term plasticity state.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a cross-sectional view illustrating a hybrid resistive memory device according to example embodiments;

FIG. 2 is a circuit diagram illustrating the hybrid resistive memory device of FIG. 1;

FIG. 6 is a graph illustrating a relationship between time and conductance when the hybrid resistive memory device of FIG. 1 includes three long-term plasticity resistive memory units and a pulse is applied.

DETAILED DESCRIPTION

Figure 1:
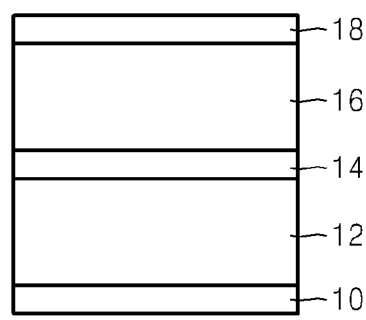

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

As used herein, the term "and/or" includes any and all combinations of one or more of the associated listed items. Expressions such as "at least one of," when preceding a list of elements, modify the entire list of elements and do not modify the individual elements of the list.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to hybrid resistive memory devices, and more particularly, to hybrid resistive memory devices including two or more resistive memory devices which are serially connected, and methods of operating and manufacturing the same.

FIG. 1 is a cross-sectional view illustrating a hybrid resistive memory device according to example embodiments. The hybrid resistive memory device includes two or more resistive memory devices.

Referring to FIG. 1, a hybrid resistive memory device includes a lower electrode 10, and a first memory resistive layer 12, an intermediate electrode 14, a second memory resistive layer 16, and an upper electrode 18, which are sequentially formed on the lower electrode 10.

The lower electrode 10, the first memory resistive layer 12, and the intermediate electrode 14 may constitute a first resistive memory device (hereinafter, referred to as a first resistive memory unit R1), and the intermediate electrode 14, the second memory resistive layer 16, and the upper electrode 18 may constitute a second resistive memory device (hereinafter, referred to as a second resistive memory unit R2).

Figure 2:
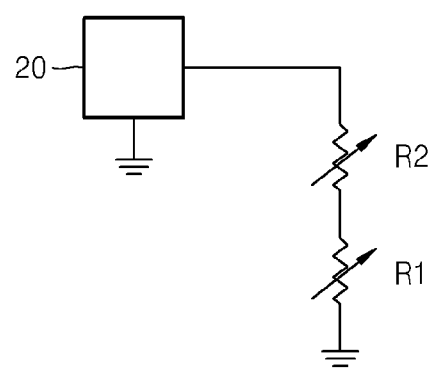

FIG. 2 is a circuit diagram illustrating the hybrid resistive memory device of FIG. 1.

Referring to FIG. 2, a first resistive memory unit R1 and a second resistive memory unit R2 are serially connected to each other, and a power supply unit 20 configured for supplying power to the first resistive memory unit R1 and/or the second resistive memory unit R2 is connected to the first resistive memory unit R1 and the second resistive memory unit R2.

The hybrid resistive memory device includes two or more resistive memory units. The resistive memory units may be divided into a resistive memory unit having a short-term plasticity (hereinafter, referred to as a short-term plasticity resistive memory unit) and a resistive memory unit having a long-term plasticity (hereinafter, referred to as a long-term plasticity resistive memory unit).

In detail, the short-term plasticity resistive memory unit may be a resistive memory unit with resistance that may change due to the movement of oxygen holes or charge trapping, and may include a memory resistive layer that is formed between electrodes and includes perovskite oxide. The perovskite oxide may be PrCaMnO (PCMO), $CaMnO_3$ (CMO), $CaTiO_3$, $BaTiO_3$, $SrTiO_3$, $KTaO_3$, $KNbO_3$, $NaNbO_3$ or a combination (or compound) thereof. Electrical properties of the short-term plasticity resistive memory unit will be explained with reference to FIG. 3A.

Figure 3A:
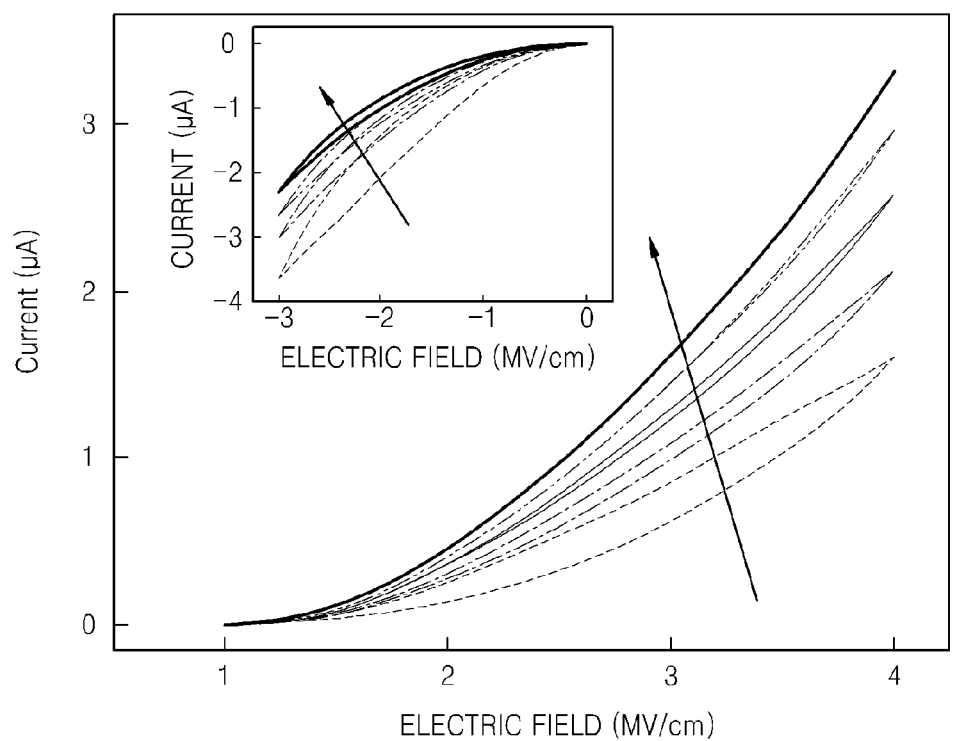
FIG. 3A is a graph for explaining an operation of a short-term plasticity resistive memory unit used in the hybrid resistive memory device of FIG. 1.

FIG. 3A is a graph for explaining an operation of a short-term plasticity resistive memory unit used in the hybrid resistive memory device of FIG. 1.

In FIG. 3A, the horizontal axis represents an electric field applied to the hybrid resistive memory device, and the vertical axis represents current flowing through a resistive layer of the short-term plasticity resistive memory unit.

Referring to FIG. 3A, as a size of the electric field is gradually increased or reduced, the current flowing through the resistive layer linearly increases in proportion to the size of the electric field. The short-term plasticity resistive memory unit may be configured to retain data for several seconds to several minutes.

A long-term plasticity resistive memory unit may be a resistive memory unit with resistance that may be changed when filaments are formed. The long-term plasticity resistive memory unit may include a memory resistive layer that is formed between electrodes and includes a transition metal oxide. The long-term plasticity resistive memory unit may be configured to retain data for several hours or more. The transition metal oxide which may be used for the memory resistive layer of the long-term plasticity resistive memory unit may be nickel (Ni) oxide, titanium (Ti) oxide, hafnium (Hf) oxide, zirconium (Zr) oxide, zinc (Zn) oxide, tungsten (W) oxide, cobalt (Co) oxide, niobium (Nb) oxide or a combination (or compound) thereof. In detail, the transition metal oxide may include at least one of NiO, $TiO_2$, HfO, ZrO, ZnO, $WO_3$, CoO, and $Nb_2O_5$, or a compound thereof. Electrical properties of the long-term plasticity resistive memory unit will be explained with reference to FIG. 3B.

Figure 3B:
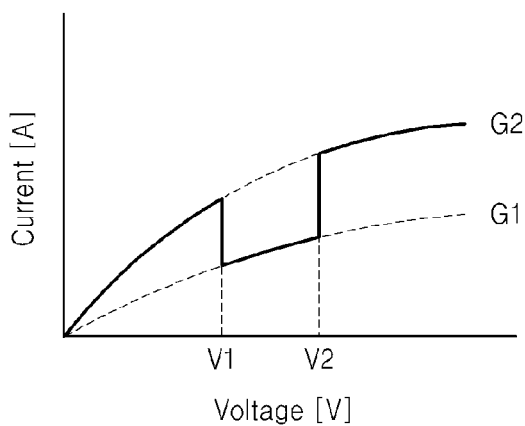
FIG. 3B is a graph for explaining an operation of a long-term plasticity resistive memory unit used in the hybrid resistive memory device of FIG. 1.

FIG. 3B is a graph for explaining an operation of a long-term plasticity resistive memory unit used in the hybrid resistive memory device of FIG. 1.

In FIG. 3B, the horizontal axis represents a voltage applied to both electrodes of the long-term plasticity resistive memory unit, and the vertical axis represents current flowing through a resistive layer of the long-term plasticity resistive memory unit.

Referring to FIG. 3B, when a size of a voltage applied from each electrode to the long-term plasticity resistive memory unit is gradually increased from 0 V, the current is increased along a curve G2 in proportion to the voltage. However, when a voltage equal to or greater than V1 is applied, a resistance of the long-term plasticity resistive memory unit is greatly increased and thus the current is reduced. When a voltage ranging from V1 to V2 is applied, the current flowing through the long-term plasticity resistive memory unit is increased along a curve G1. In addition, when a voltage equal to or greater than V2 is applied, the resistance is sharply reduced and the current is increased along the curve G2 again.

Electrical properties of the long-term plasticity resistive memory unit are affected when a voltage greater than V1 is applied and then a voltage less than V1 is applied, which will be explained in detail. First, after a voltage ranging from V1 to V2 is applied to the long-term plasticity resistive memory unit, current increases along the curve G1 when a voltage less than V1 is applied. After a voltage greater than V2 is applied to the long-term plasticity resistive memory unit, current increases along the curve G2 when a voltage less than V1 is applied. Accordingly, electrical properties are affected by a voltage greater than V1 (i.e., ranging from V1 to V2 or greater than V2) that is applied to the long-term plasticity resistive memory unit.

The hybrid resistive memory device includes at least one long-term plasticity resistive memory unit. For example, one of the first resistive memory unit R1 and the second resistive memory unit R2 may be a long-term plasticity resistive memory unit and the other may be a short-term plasticity resistive memory unit, or both the first resistive memory unit R1 and the second resistive memory unit R2 may be long-term plasticity resistive memory units. When the hybrid resistive memory device includes three or more resistive memory units, the hybrid resistive memory device includes at least one long-term plasticity resistive memory unit, and the remaining ones may be short-term plasticity or long-term plasticity resistive memory units.

Each of the lower electrode 10, the intermediate electrode 14, and the upper electrode 18 may be formed of a conductive material (e.g., a metal), a conductive metal oxide, or a conductive metal nitride. In detail, each of the lower electrode 10, the intermediate electrode 14, and the upper electrode 18 may be formed of aluminum (Al), gold (Au), copper (Cu), cobalt (Co), zirconium (Zr), zinc (Zn), tungsten (W), iridium (Ir), ruthenium (Ru), platinum (Pt), titanium (Ti), hafnium (Hf), TiN or a compound (or combination) thereof.

The hybrid resistive memory device may be driven while being connected to a switching element (e.g., a transistor or a diode).

The hybrid resistive memory device may be manufactured by using physical or chemical growth by sequentially forming the first memory resistive layer 12, the intermediate electrode 14, the second memory resistive layer 16, and the upper electrode 18 on the lower electrode 10.

The hybrid resistive memory device may operate to form a short-term plasticity state and a long-term plasticity state by gradually increasing a voltage applied by a power supply unit to its memory unit in order to gradually increase retention properties.

A method of operating the hybrid resistive memory device will be explained with reference to FIGS. 4A through 4E. A case where the hybrid resistive memory device includes one long-term plasticity resistive memory unit $R_F$ and one short-term plasticity resistive memory unit $R_O$ will be explained.

Figure 4A:
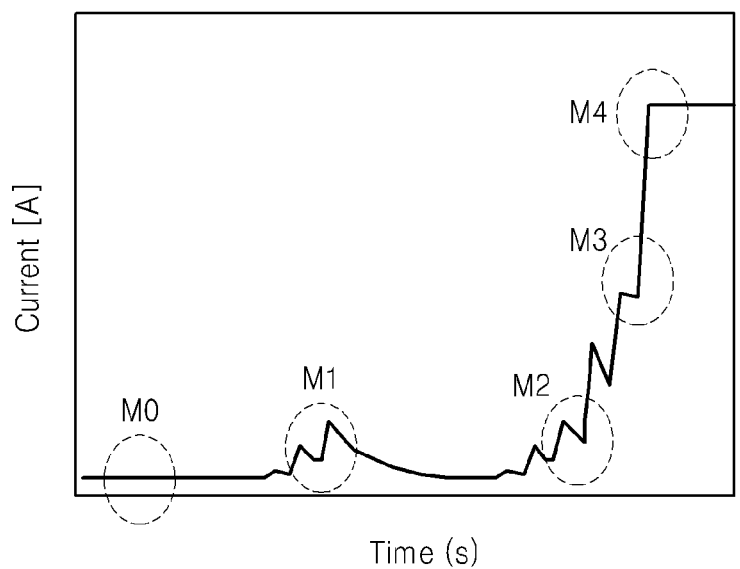
FIG. 4A is a graph illustrating a relationship between time and current when a voltage applied to the hybrid resistive memory device is increased.

FIG. 4A is a graph illustrating a relationship between time and current when a voltage applied to the hybrid resistive memory device is increased. FIGS. 4B through 4E are circuit diagrams illustrating resistances in states M0 through M4.

Figure 4B:
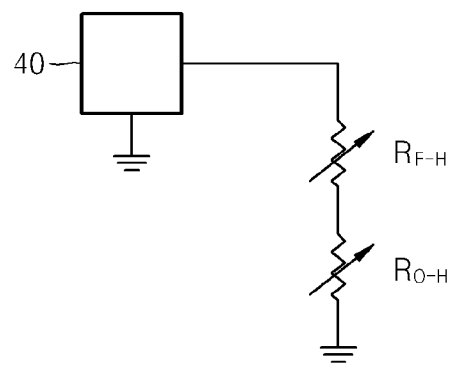
FIGS. 4B through 4E are circuit diagrams illustrating resistances in various states.

Referring to FIGS. 4A and 4B, the short-term plasticity resistive memory unit $R_O$ and the long-term plasticity resistive memory unit $R_F$ are serially connected, and the long-term plasticity resistive memory unit $R_F$ is connected to a power supply unit 40. In the initial state M0 in which no voltage is applied, resistances of the short-term plasticity resistive memory unit $R_O$ and the long-term plasticity resistive memory unit $R_F$ are $R_{o-H}$ and $R_{F-H}$, which are high, and there is no change in the current.

Figure 4C:
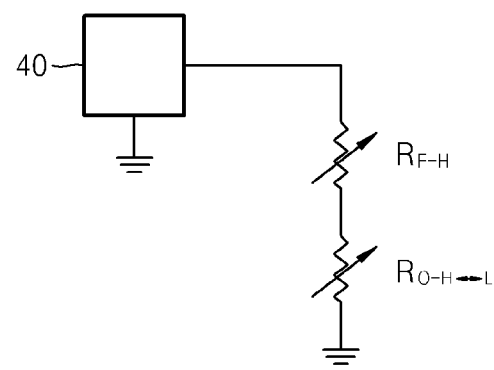

Referring to FIGS. 4A and 4C, when the voltage applied by the power supply unit 40 is increased, the resistance of the short-term plasticity resistive memory unit $R_O$ is reduced to $R_{o-H->L}$. Accordingly, an overall resistance of the hybrid resistive memory device is reduced and the current flowing through the hybrid resistive memory device is increased to the states M1 and M2. For reference, when the voltage applied by the power supply unit 40 does not change the resistance of the long-term plasticity resistive memory unit $R_F$, only the resistance of the short-term plasticity resistive memory unit $R_O$ may be changed and there may be no additional change in the current in the state M1. When the voltage is continuously increased, the resistance of the short-term plasticity resistive memory unit $R_O$ may be reduced in the state M2 and the resistance of the long-term plasticity resistive memory unit $R_F$ may be changed.

Figure 4D:
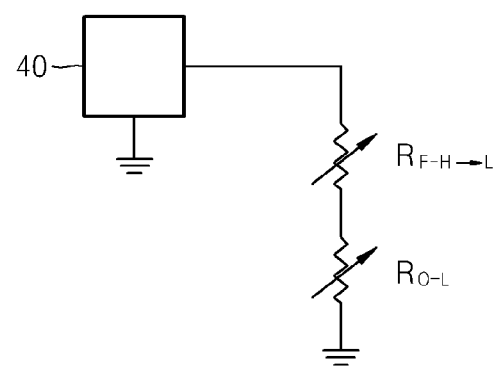

Referring to FIGS. 4A and 4D, when the voltage is continuously increased, the resistance of the short-term plasticity resistive memory unit $R_O$ is maintained at $R_{o-L}$, which is low. Because the resistance of the long-term plasticity resistive memory unit $R_F$ is reduced to $R_{F-H->L}$, the overall resistance of the hybrid resistive memory device is reduced in the state M3.

Figure 4E:
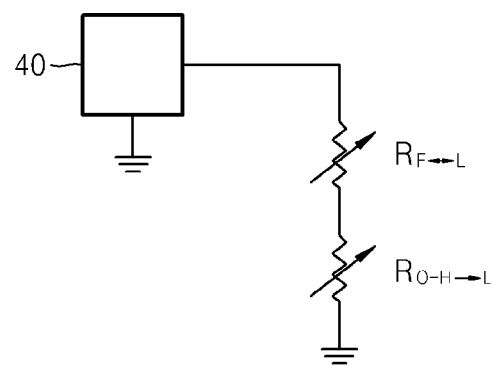

Referring to FIGS. 4A and 4E, when the resistance of the long-term plasticity resistive memory unit $R_F$ is changed by increasing the voltage applied by the power supply unit 40, the overall resistance of the hybrid resistive memory device is reduced to a lowest one in the state M4 because the resistance of the long-term plasticity resistive memory unit $R_F$ is changed to $R_{F-L}$, which is low.

Figure 5A:
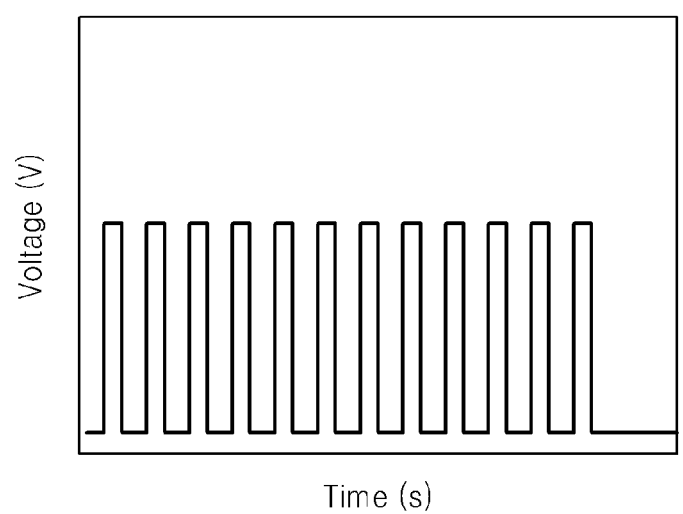
FIGS. 5A and 5B are graphs illustrating a relationship between time and a voltage applied to the hybrid resistive memory device of FIG. 1.
Figure 5B:
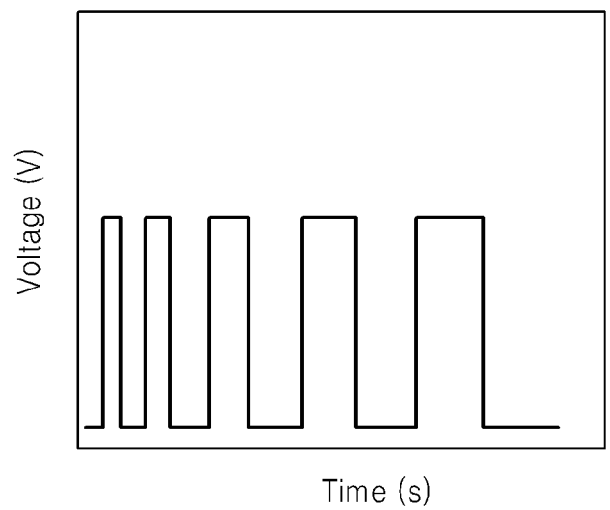

FIGS. 5A and 5B are graphs illustrating a relationship between time and a voltage applied to the hybrid resistive memory device of FIG. 1.

A pulse voltage applied by the power supply unit 40 may be arbitrarily determined and applied according to characteristics of each memory unit to which the pulse voltage is applied. For example, a constant pulse voltage may be periodically applied as shown in FIG. 5A, or a pulse voltage with a width which increases as time goes on may be applied from an electrode as shown in FIG. 5B.

The hybrid resistive memory device may be configured in various manners, and may include two or more long-term plasticity resistive memory units.

Figure 6:
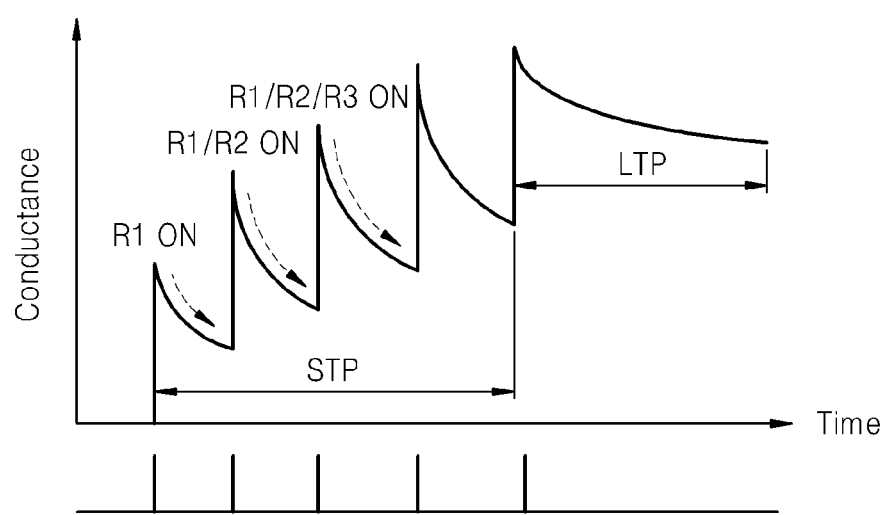

FIG. 6 is a graph illustrating a relationship between time and conductance when the hybrid resistive memory device includes three long-term plasticity resistive memory units.

The hybrid resistive memory device includes the first resistive memory unit R1, the second resistive memory unit R2, a third resistive memory unit R3. The first through third resistive memory units R1 through R3 are long-term plasticity resistive memory units which are serially connected, and a pulse is applied. It is assumed that initial resistances of the first through third resistive memory units R1, R2, and R3 satisfy R1>R2>R3.

Referring to FIG. 6, when a plurality of long-term plasticity resistive memory units (i.e., the first through resistive memory units R1, R2, and R3) are serially connected and a pulse voltage is applied by a power supply unit, the resistive memory unit having a higher resistance (e.g., the first resistive memory unit R1) than the others is first changed to have a low resistance, and a higher voltage is applied to the remaining two resistive devices (e.g., the second and third resistive memory units R2 and R3). When the pulse voltage is continuously applied, the second resistive memory unit R2 is changed to have a low resistance. When the pulse voltage is continuously applied, most of the voltage is applied to the third resistive memory unit R3 and the third resistive memory unit R3 is finally changed to have a lowest resistance. When a pulse voltage is initially applied, a resistance may be sequentially reduced and a short-term plasticity may occur, and when the pulse voltage is continuously applied, retention properties may be improved and a long-term plasticity may occur.

As such, when a voltage applied to the hybrid resistive memory device is gradually increased as time passes, a resistance of a short-term plasticity resistive memory unit may be changed to partially reduce a resistance of the hybrid resistive memory device, and also, when the voltage is further increased, a resistance of a long-term plasticity resistive memory unit may be further reduced. That is, the hybrid resistive memory device may be driven while having multi-level resistances. Also, because the short-term plasticity resistive memory unit $R_O$ has a shorter data retention time and the long-term plasticity resistive memory unit $R_F$ has a longer data retention time, the hybrid resistive memory device having characteristics similar to those of a synapse may be obtained.

According to the hybrid resistive memory device of example embodiments, the hybrid resistive memory device may be driven while having multi-level resistances and the hybrid resistive memory device having characteristics similar to those of a synapse may be obtained because the hybrid resistive memory device may operate in a short-term plasticity state and a long-term plasticity state.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A hybrid resistive memory device, comprising:
   at least two resistive memory units,
   wherein at least one of the at least two resistive memory units is a resistive memory unit configured to operate in a long-term plasticity state,
   wherein at least one of the at least two resistive memory units is a resistive memory unit configured to operate in a short-term plasticity state, and
   wherein the at least two resistive memory units are configured to attain the short-term plasticity state and the long-term plasticity state from a gradual increase in voltage from a power supply unit to the at least two resistive memory units.

2. The hybrid resistive memory device of claim 1, wherein,
   the resistive memory unit configured to operate in the short-term plasticity state includes a memory resistive layer between electrodes, and
   the memory resistive layer includes a perovskite oxide.

3. The hybrid resistive memory device of claim 2, wherein the memory resistive layer includes at least one selected from PrCaMnO (PCMO), $CaMnO_3$ (CMO), $CaTiO_3$, $BaTiO_3$, $SrTiO_3$, $KTaO_3$, $KNbO_3$, $NaNbO_3$ and a combination thereof.

4. The hybrid resistive memory device of claim 1, wherein the resistive memory unit configured to operate in the short-term plasticity state has a resistance that changes due to movement of oxygen holes or charge trapping.

5. The hybrid resistive memory device of claim 1, wherein the at least two resistive memory units are resistive memory units configured to operate in the long-term plasticity state.

6. The hybrid resistive memory device of claim 1, wherein,
   the resistive memory unit configured to operate in the long-term plasticity state includes a memory resistive layer between electrodes, and
   the memory resistive layer includes a transition metal oxide.

7. The hybrid resistive memory device of claim 6, wherein the transition metal oxide is one selected from a nickel (Ni) oxide, a titanium (Ti) oxide, a hafnium (Hf) oxide, a zirconium (Zr) oxide, a zinc (Zn) oxide, a tungsten (W) oxide, a cobalt (Co) oxide, a niobium (Nb) oxide and a combination thereof.

8. The hybrid resistive memory device of claim 1, wherein the resistive memory unit configured to operate in the long-term plasticity state has a resistance that changes when filaments are formed.

9. The hybrid resistive memory device of claim 1 wherein the at least two resistive memory units include:
   a lower electrode, and
   a first memory resistive layer, an intermediate electrode, a second memory resistive layer, and an upper electrode sequentially stacked on the lower electrode.

10. The hybrid resistive memory device of claim 9, wherein each of the lower electrode, the intermediate electrode, and the upper electrode includes at least one selected from aluminum (Al), gold (Au), copper (Cu), cobalt (Co), zirconium (Zr), zinc (Zn), tungsten (W), iridium (Ir), ruthenium (Ru), platinum (Pt), titanium (Ti), hafnium (Hf), TiN and a combination thereof.

11. The hybrid resistive memory device of claim 1, wherein the at least two resistive memory units are serially connected.

12. A method of operating a hybrid resistive memory device including at least two resistive memory units, the method comprising:
   forming a short-term plasticity state and a long-term plasticity state in the at least two resistive memory units by gradually increasing a voltage applied by a power supply unit to the at least two resistive memory units,
   wherein at least one of the at least two resistive memory units is configured to operate in the long-term plasticity state.

13. The method of claim 12, wherein,
   at least one of the at least two resistive memory units is a resistive memory unit configured to operate in the short-term plasticity resistive state, and
   the forming of the short-term plasticity state and the long-term plasticity state includes reducing a resistance of the resistive memory unit configured to operate in the long-term plasticity state by applying a pulse voltage using the power supply unit, after reducing a resistance of the resistive memory unit configured to operate in the short-term plasticity resistive state.

14. The method of claim 12, wherein,
   the at least two resistive memory units are resistive memory units configured to operate in the long-term plasticity state, and
   the forming of the short-term plasticity state and the long-term plasticity state includes sequentially reducing resistances of the resistive memory units configured to operate in the long-term plasticity state by applying a pulse voltage using the power supply unit.

15. A method of manufacturing a hybrid resistive memory device including at least two resistive memory units, the method comprising:
   sequentially forming a first memory resistive layer, an intermediate electrode, a second memory resistive layer, and an upper electrode on a lower electrode,
   wherein at least one of the at least two resistive memory units is configured to operate in a long-term plasticity state, and
   wherein at least one of the at least two resistive memory units is configured to operate in a short-term plasticity state the at least two resistive memory units configured such that the short-term plasticity state and the long-term plasticity state are formed from a gradual increase in voltage applied by a power supply unit to the at least two resistive memory units.

* * * * *